(12) United States Patent
Furukawahara et al.

(10) Patent No.: US 7,833,353 B2
(45) Date of Patent: Nov. 16, 2010

(54) LIQUID MATERIAL VAPORIZATION APPARATUS FOR SEMICONDUCTOR PROCESSING APPARATUS

(75) Inventors: Kazunori Furukawahara, Tama (JP); Hideaki Fukuda, Tama (JP)

(73) Assignee: ASM Japan K.K., Tokyo (JP)

( * ) Notice: Subject to any disclaimer, the term of this patent is extended or adjusted under 35 U.S.C. 154(b) by 624 days.

(21) Appl. No.: 11/626,777

(22) Filed: Jan. 24, 2007

(65) Prior Publication Data

US 2008/0173240 A1 Jul. 24, 2008

(51) Int. Cl.
*C23C 16/455* (2006.01)
*B01D 1/14* (2006.01)
(52) U.S. Cl. ............... 118/726; 392/394; 392/402; 392/405; 422/228; 422/236
(58) Field of Classification Search ............... 118/726; 392/386, 394, 402, 405, 387, 324; 210/532, 210/533, 537, 538, 540, 197, 804; 422/228, 422/236
See application file for complete search history.

(56) References Cited

U.S. PATENT DOCUMENTS

| 87,192 | A | | 2/1869 | Paine |
| 113,147 | A | | 3/1871 | Dupas et al. |
| 160,410 | A | | 3/1875 | Ferguson |
| 230,656 | A | | 8/1880 | Radkey |
| 1,103,789 | A | | 7/1914 | Macey |
| 1,525,786 | A | | 2/1925 | Waldo |
| 1,736,325 | A | * | 11/1929 | Parmelee ............... 196/108 |
| 1,860,111 | A | | 5/1932 | Miller |
| 2,206,688 | A | | 7/1940 | Bloomheart |
| 2,333,898 | A | | 11/1943 | Stevenson et al. |
| 3,731,802 | A | * | 5/1973 | James ............... 210/774 |
| 3,912,795 | A | | 10/1975 | Jackson |
| 3,957,467 | A | | 5/1976 | Kim |
| 3,989,477 | A | | 11/1976 | Wilson et al. |
| 4,268,279 | A | | 5/1981 | Shindo et al. |
| 4,276,243 | A | * | 6/1981 | Partus ............... 261/128 |
| 4,389,973 | A | | 6/1983 | Suntola et al. |

(Continued)

FOREIGN PATENT DOCUMENTS

DE    33 39 625 C2    1/1991

(Continued)

OTHER PUBLICATIONS

Leskelä et al., "ALS precursor chemistry: Evolution and future challenges," *Journal de Physique* IV France 9, 837-852.

(Continued)

*Primary Examiner*—Tu B Hoang
*Assistant Examiner*—Jianying Atkisson
(74) *Attorney, Agent, or Firm*—Knobbe, Martens, Olson & Bear, LLP

(57) ABSTRACT

A liquid material vaporization apparatus for a semiconductor processing apparatus includes: a vaporization tank; an inner partition wall disposed in the tank for dividing the interior of the tank into a charging compartment and a vaporization compartment which are liquid-communicatable with each other over an upper edge of the inner partition wall. A liquid material charged in the charging compartment overflows over the upper edge of the inner partition wall toward the vaporization compartment to store and vaporize the liquid material in the vaporization compartment.

19 Claims, 3 Drawing Sheets

U.S. PATENT DOCUMENTS

| | | | |
|---|---|---|---|
| 4,393,013 A | 7/1983 | McMenamin | |
| 4,436,674 A | 3/1984 | McMenamin | |
| 4,548,138 A | 10/1985 | Korenberg | |
| 4,774,032 A | 9/1988 | Coates et al. | |
| 4,783,343 A | 11/1988 | Sato | |
| 4,883,362 A | 11/1989 | Gärtner et al. | |
| 4,904,419 A | 2/1990 | Reynolds | |
| 4,911,101 A | 3/1990 | Ballingall, III et al. | |
| 4,947,790 A | 8/1990 | Gärtner et al. | |
| 5,053,132 A | 10/1991 | Sirkar | |
| 5,143,526 A | 9/1992 | Lee et al. | |
| 5,199,603 A | 4/1993 | Prescott | |
| 5,385,689 A | 1/1995 | Tom et al. | |
| 5,543,043 A | 8/1996 | Bates et al. | |
| 5,551,278 A | 9/1996 | Rounbehler et al. | |
| 5,674,574 A | 10/1997 | Atwell et al. | |
| 5,698,037 A | 12/1997 | Stauffer | |
| 5,711,816 A | 1/1998 | Kirlin et al. | |
| 5,904,771 A | 5/1999 | Tasaki et al. | |
| 6,033,493 A | 3/2000 | Hertz et al. | |
| 6,132,492 A | 10/2000 | Hultquist et al. | |
| 6,220,091 B1 | 4/2001 | Chen et al. | |
| 6,231,641 B1 | 5/2001 | Utigard et al. | |
| 6,325,017 B1 | 12/2001 | DeBoer et al. | |
| 6,582,496 B1 | 6/2003 | Cheng et al. | |
| 6,868,869 B2 * | 3/2005 | Olander | 137/888 |
| 6,905,541 B2 | 6/2005 | Chen et al. | |
| 7,156,380 B2 | 1/2007 | Soininen | |
| 7,186,385 B2 | 3/2007 | Ganguli et al. | |
| 7,270,709 B2 | 9/2007 | Chen et al. | |
| 7,464,917 B2 * | 12/2008 | Lee et al. | 261/121.1 |
| 2001/0042523 A1 | 11/2001 | Kesala | |
| 2002/0007849 A1 * | 1/2002 | Wang et al. | 137/263 |
| 2003/0053799 A1 | 3/2003 | Lei | |
| 2004/0016404 A1 | 1/2004 | Gregg et al. | |
| 2005/0072357 A1 | 4/2005 | Shero et al. | |
| 2005/0263075 A1 * | 12/2005 | Wang et al. | 118/726 |

FOREIGN PATENT DOCUMENTS

| | | | |
|---|---|---|---|
| GB | 2 151 662 A | | 7/1985 |
| JP | 011 168092 | | 6/1999 |
| JP | 2002-90077 A | | 3/2002 |
| JP | 2002-220669 | | 8/2002 |
| JP | 2006045637 A | * | 2/2006 |
| WO | WO 2004/011695 | | 2/2004 |

OTHER PUBLICATIONS

Smith, J.M., *Chemical Engineering Kinetics*, 3$^{rd}$ Edition, McGraw-Hill Book Company, p. 268-291 (1981).

Smith, J.M., *Chemical Engineering Kinetics*, 3$^{rd}$ Edition, McGraw-Hill Book Company, p. 554-563 (1981).

Suntola, "Atomic Layer Epitaxy," *Thin Solid Films*, 216: 84-89 (1992).

* cited by examiner

LIQUID MATERIAL VAPORIZATION APPARATUS FOR SEMICONDUCTOR PROCESSING APPARATUS

BACKGROUND OF THE INVENTION

1. Field of the Invention

The present invention generally relates to a liquid material vaporization apparatus for a semiconductor processing apparatus, particularly to a liquid material vaporization apparatus comprising a vaporization tank provided upstream of a semiconductor processing apparatus to supply a vaporized material thereto.

2. Description of the Related Art

A liquid material vaporizer is provided with a vaporization tank which has a small capacity so that its footprint can be small. If a liquid material which has passed through a room temperature environment is charged into the small vaporization tank, the temperature of the liquid material stored in the vaporization tank suddenly decreases, thereby rendering gas flow unstable. In order to stabilize gas flow, the capacity of the vaporization tank needs to be larger, or vaporization needs to be held off until the temperature of the liquid material stored in the tank becomes high. Alternatively, the liquid material needs to be sufficiently heated before charging the liquid material into the vaporization apparatus as shown in FIG. 1.

In FIG. 1, a liquid material at room temperature is fist passed through a preheating section 13 provided with a heater 9, which is disposed upstream of a liquid material vaporization apparatus 10, so as to increase the temperature of the liquid material before being charged into the liquid material vaporization apparatus 10. The flow of the liquid material supplied to a vaporization tank 11 is controlled by a valve 6. The liquid material which has been heated is supplied near a bottom of the tank 11 via a liquid material flow line 5. The tank is provided with a heater 3 to heat the liquid material 2 inside the tank 11. The tank is a gas-tight container and the heated liquid material is vaporized inside the tank. The vaporized material is temporarily held in a vaporization compartment 12 and is discharged therefrom to a reactor via a gas flow line 4 which is provided with a valve 7 and a mass flow controller 8. The vaporization tank 11, the heater 3, the liquid material flow line 5 provided with the valve 6, and the gas flow line provided with the valve 7 and the mass flow controller 8 are enclosed in a housing 1 in order to facilitate temperature control of the above elements without influence from outside temperature changes.

In the above, if the liquid material is insufficiently heated upstream of the vaporization apparatus 1, the temperature of the liquid material in the tank fluctuates, thereby rendering the flow of vaporized material (gas flow) unstable. In order to stabilize gas flow, it may be required to wait until the temperature of the liquid material in the tank reaches a certain point. Further, the preheating section 13 uses a significant space, preventing minimization of the footprint of the vaporization apparatus. Furthermore, the preheating section including the heater is additional equipment and requires additional control.

SUMMARY OF THE INVENTION

According to an embodiment which can solve one or more of the above problems, the present invention provides a liquid material vaporization apparatus for a semiconductor processing apparatus, comprising: (i) a vaporization tank having an interior for containing both a liquid material and a vaporized material of the liquid material; (ii) an inner partition wall disposed in the tank and having an upper edge for dividing the interior of the tank into a charging compartment and a vaporization compartment which are liquid-communicatable with each other over the upper edge of the inner partition wall, wherein a liquid material charged in the charging compartment overflows over the upper edge of the inner partition wall toward the vaporization compartment to store and vaporize the liquid material in the vaporization compartment; (iii) a liquid material inlet disposed near a bottom of the charging compartment, for supplying the liquid material into the charging compartment of the tank; (iv) a vaporized material outlet disposed in an upper portion of the vaporization compartment of the tank, for discharging a vaporized material of the liquid material from the vaporization compartment of the tank; and (v) a heater for heating and vaporizing the liquid material in the tank.

According to another embodiment, the present invention provides a semiconductor processing apparatus comprising: (I) a reactor for processing a substrate by any suitable chemical vapor deposition (CVD) including thermal CVD, plasma enhanced CVD (PECVD), and atomic layer CVD (ALCVD); and (II) the liquid material vaporization apparatus of any of the foregoing coupled to the reactor for supplying a vaporized material to the reactor for the processing.

According to still another embodiment, the present invention provides a method of vaporizing a liquid material for a semiconductor processing apparatus, comprising: (a) intermittently supplying through a liquid material inlet a liquid material into a charging compartment of a vaporization tank having an interior for containing both a liquid material and a vaporized material of the liquid material, said tank being heated, said liquid material inlet being disposed near a bottom of the charging compartment, wherein an inner partition wall having an upper edge divides an interior of the tank into the charging compartment and a vaporization compartment which are liquid-communicatable with each other over the upper edge of the inner partition wall; (b) overflowing the liquid material charged in the charging compartment over the upper edge of the inner partition wall toward the vaporization compartment, said overflowing liquid material having a higher temperature than the liquid material supplied to the charging compartment; (c) storing and vaporizing the liquid material in the vaporization compartment; and (d) discharging a vaporized material out of the vaporization compartment through a vaporized material outlet.

The above embodiments include, but are not limited to, embodiments shown in the present disclosure. In an embodiment, by dividing the vaporization tank into a vaporization compartment and a charging compartment to which a liquid material at room temperature is charged, a decrease of temperature of the liquid material in the vaporization compartment can effectively be inhibited. In an embodiment, by charging the liquid material in the charging compartment, the liquid material can be gradually heated in the charging compartment without special or additional heating before being sent to the vaporization compartment. In an embodiment, by dividing the vaporization tank into the charging compartment and the vaporization compartment at a bottom of the tank, a liquid material at room temperature newly introduced in the charging compartment stays at a bottom of the charging compartment, and the only liquid material previously charged in the charging compartment which has been heated moves upwards and overflows over an upper portion of the partition wall to the vaporization compartment. In an embodiment, by making the partition wall using a material having a lower thermal conductivity, such as quartz or resin, than that of a material constituting the tank, a decrease of temperature of the liquid material in the vaporization compartment can effectively be inhibited.

For purposes of summarizing the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not to scale.

DETAILED DESCRIPTION OF THE PREFERRED EMBODIMENT

Figure 1:
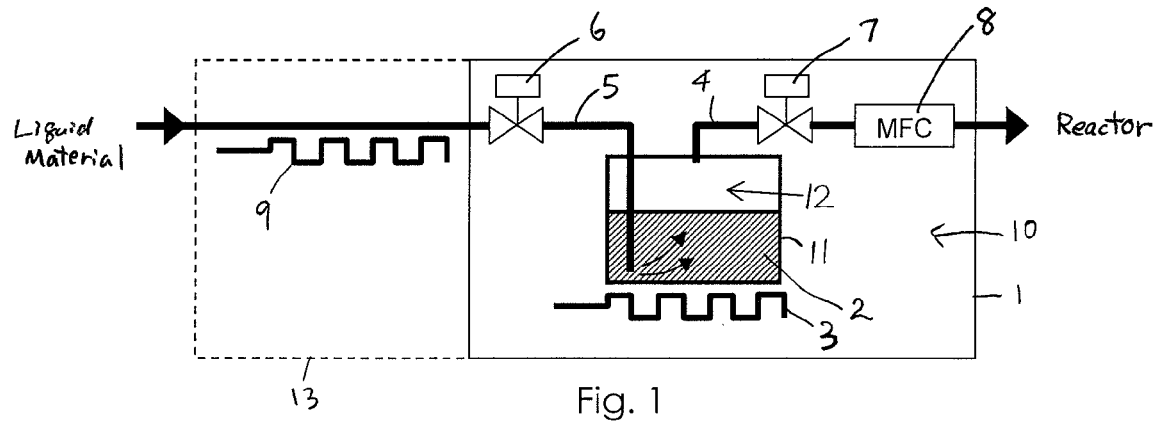
FIG. 1 is a schematic diagram of a conventional liquid material vaporization apparatus.

The present invention will be explained in detail with reference to preferred embodiments. The preferred embodiments are not intended to limit the present invention. In embodiments, the present invention is characterizable by providing a charging compartment which is formed inside a vaporization tank, as a buffering zone for preventing sudden temperature changes. The liquid material may be first charged into the charging compartment and heated, causing thermal convection current, whereby the liquid material at an upper portion of the charging compartment, which has a higher temperature than that at a lower portion of the charging compartment, moves to a vaporization compartment, while the liquid material having a lower temperature stays at a bottom of the charging compartment and is gradually heated. In the above embodiments, because the only sufficiently heated portion of the liquid material moves to the vaporization compartment, fluctuation of the temperature of the liquid material in the vaporization compartment can effectively be controlled, thereby stabilizing gas flow. In embodiments, the charging of the liquid material to the charging compartment is conducted intermittently, and at each charge, the above described temperature-stabilizing mechanism takes place.

In a preferred embodiment, a liquid material vaporization apparatus for a CVD apparatus, comprising: (i) a vaporization tank having an interior for containing both a liquid material and a vaporized material of the liquid material; (ii) an inner partition wall disposed in the tank and having an upper edge for dividing the interior of the tank into a charging compartment and a vaporization compartment which are liquid-communicatable with each other over the upper edge of the inner partition wall, wherein a liquid material charged in the charging compartment overflows over the upper edge of the inner partition wall toward the vaporization compartment to store and vaporize the liquid material in the vaporization compartment; (iii) a liquid material inlet disposed near a bottom of the charging compartment, for supplying the liquid material into the charging compartment of the tank; (iv) a vaporized material outlet disposed in an upper portion of the vaporization compartment of the tank, for discharging a vaporized material of the liquid material from the vaporization compartment of the tank; and (v) a heater for heating and vaporizing the liquid material in the tank.

The above embodiment further includes, but is not limited to, the following embodiments:

The inner partition wall may extend upward from a bottom of the tank and may have an upper end forming the upper edge. The liquid material vaporization apparatus may further comprise another partition wall which is disposed downstream of and in the vicinity of the partition wall and which extends from a ceiling of the tank, wherein a lower end of the other partition wall is disposed near the bottom of the tank to flow the liquid material under the lower end to the vaporization compartment after the liquid material overflows over the upper edge of the partition wall. The vaporized material outlet may be connected to branched flow lines for supplying the vaporized material to multiple reactors.

In other embodiments, the inner partition wall may extend downwards from a ceiling and may have a U-shaped cross sectional portion having an end forming the upper edge, wherein a bottom of the U-shaped cross sectional portion is disposed near a bottom of the tank. The upper edge of the U-shaped cross sectional portion may be disposed near a side wall of the tank to flow the liquid material between the U-shaped cross sectional portion and the side wall and under the bottom of the U-shaped cross sectional portion to the vaporization compartment after the liquid material overflows over the upper edge of the U-shaped cross sectional portion. The partition wall may be disposed nearly in a middle of the tank to divide the vaporization compartment into first and second vaporization compartments, and the vaporized material outlet may comprise first and second vaporized material outlets provided in the first and second vaporization compartments, respectively, said vaporization apparatus further comprising another partition wall which is disposed downstream of and in the vicinity of the U-shaped cross sectional portion and which extends from a ceiling of the tank, wherein a lower end of the other partition wall is disposed near the bottom of the tank to flow the liquid material under the lower end to both the first and second vaporization compartments after the liquid material overflows over the upper edge of the U-shaped cross sectional portion.

In the embodiments where the liquid material moves to the vaporization compartment near the bottom of the tank after overflowing over the partition wall, a gas phase above the charging compartment is isolated from the vaporization compartment with regard to gas-mixing, and thus, gas in the vaporization compartment receives less thermal influence from the gas phase above the charging compartment.

In embodiments, the vaporized material outlet may be connected to a flow line provided with a valve and a mass flow controller.

In embodiments, the charging compartment has a volume which may be less than about 30%, e.g., about 2% to about 20% (including 5%, 10%, 15%, and values between any two numbers of the foregoing) of the volume of the interior of the tank, said volume of the charging compartment being a volume of the liquid material which can be stored until the liquid material overflows over the upper edge. In embodiments, the volume of the interior of the tank may be about 500 cc to about 3,000 cc, e.g., about 1,000 cc to about 2,000 cc. In embodiments, the charging compartment may have a volume of about 10 cc to about 400 cc, e.g., about 40 cc to about 200 cc (including 50 cc, 100 cc, 150 cc, and values between any two numbers of the foregoing), which is defined as a volume of the liquid material which can be stored until the liquid material overflows over the upper edge. The volume of the charging compartment may be 1.5 times greater (including 2 times, 3 times, 5 times, 7 times, and values between any two numbers of the foregoing) than the volume of the liquid material intermittently charged at a time. In embodiments, the volume of the liquid material intermittently charged at a time may be about 5 cc to about 20 cc (including 10 cc, 15 cc, and values between any two numbers of the foregoing). In embodiments, the charging of the liquid material may be complete in a few seconds to 20 seconds (including 3-10 seconds, e.g., about 5 seconds), and in that case, the flow rate of the liquid material may be about 0.1 cc/sec to about 5 cc/sec (including 0.5 cc/sec to about 1.7 cc/sec). The flow of the liquid material can be controlled so that only the heated liquid material can move to the vaporization compartment.

In the above, the liquid material inlet may be connected to a flow line provided with a valve which allows intermittent supply of the liquid material to the charging compartment.

In embodiments, the height of the partition wall may be 50% to 95% (60%, 70%, 80%, 90%, and values between any two numbers of the foregoing) of the inner height of the tank.

In embodiments, the tank and the partition wall may be made of stainless steel such as SUS316. The tank and the partition wall may be welded together. In that case, it is easy to perform electro polishing of the entire tank including the partition wall so as to make the inner surfaces highly clean. In other embodiments, the partition wall may be made of a material having low thermal conductivity such as quartz glass or resin so as to inhibit a decrease of the temperature of the liquid material.

In another embodiment, a semiconductor processing apparatus comprises: (I) a reactor for processing a substrate by chemical vapor deposition (CVD), physical vapor deposition (PVD), or atomic layer deposition (ALD); and (II) the liquid material vaporization apparatus of any of the foregoing coupled to the reactor for supplying a vaporized material to the reactor for the processing. In embodiments, the apparatus may be provided with no preheating device for heating the liquid material upstream of the liquid material vaporization apparatus.

In still another embodiment, a method of vaporizing a liquid material for a semiconductor processing apparatus, comprises: (a) intermittently supplying through a liquid material inlet a liquid material into a charging compartment of a vaporization tank having an interior for containing both a liquid material and a vaporized material of the liquid material, said tank being heated, said liquid material inlet being disposed near a bottom of the charging compartment, wherein an inner partition wall having an upper edge divides an interior of the tank into the charging compartment and a vaporization compartment which are liquid-communicatable with each other over the upper edge of the inner partition wall; (b) overflowing the liquid material charged in the charging compartment over the upper edge of the inner partition wall toward the vaporization compartment, said overflowing liquid material having a higher temperature than the liquid material supplied to the charging compartment; (c) storing and vaporizing the liquid material in the vaporization compartment; and (d) discharging a vaporized material out of the vaporization compartment through a vaporized material outlet.

In embodiments, the liquid material may be charged in the charging compartment at a time in an amount which is less than 50% (including 40%, 30%, 20%, 10%, and values between any two numbers of the foregoing) of a volume of the charging compartment being a volume of the liquid material which can be stored until the liquid material overflows over the upper edge.

In embodiments, the liquid material supplied to the charging compartment of the tank may be at room temperature.

In embodiments, the liquid material may be selected from the group consisting of TEOS, TMP, TMB, TEOP, TMOP, TEB, DMDMOS, 3MS, and 4MS.

In embodiments, a ratio of liquid phase to gas phase in the tank by volume may be 50/50 to 95/5, preferably 70/30 to 90/10, so that it is possible to obtain a sufficient volume of vaporized material. If the volume of the liquid material is small, the temperature of the liquid material tends to change easily.

In all of the aforesaid embodiments, any element used in an embodiment can interchangeably or additionally be used in another embodiment unless such a replacement or addition is not feasible or causes adverse effect. Further, the present invention can equally be applied to apparatuses and methods.

The present invention will be explained with respect to the drawings. However, the drawings are not intended to limit the present invention. Further, in the present disclosure where conditions and/or structures are not specified, the skilled artisan in the art can readily provide such conditions and/or structures, in view of the present disclosure, as a matter of routine experimentation.

Figure 2:
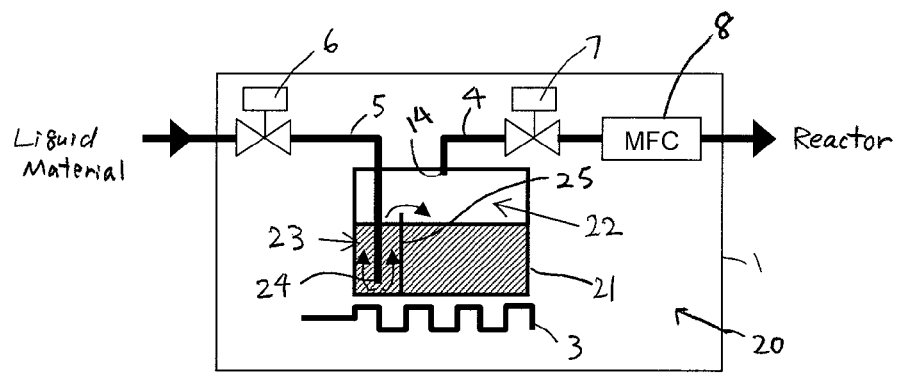
FIGS. 2-7 are schematic diagrams of liquid material vaporization apparatuses according to embodiments of the present invention.

FIG. 2 is a schematic diagram of a liquid material vaporization apparatus according to an embodiment of the present invention. The same reference numbers as in FIG. 1 indicate generally or substantially the same elements as in FIG. 1. In this embodiment, in a liquid material vaporization apparatus 20, an inner partition wall 25 extends upward from a bottom of a tank 21 and has an upper edge, thereby forming a charging compartment 23 separated from a vaporization compartment 22. A liquid material inlet 24 of the liquid material flow line 5 is located near the bottom of the charging compartment 23. The liquid material overflows over the upper edge of the partition wall 25 toward the vaporization compartment 22. The vaporized material is discharged from a vaporized material outlet 14 is located on a ceiling of the tank. The heater 3 is located under the tank 21. However, the heater can be disposed at any suitable portion of the tank such as a side wall of the tank. The position of the vaporized material outlet 14 is not limited to the ceiling of the tank but can be any suitable location of the tank. Although the position of the liquid material inlet 24 may be the vicinity of the bottom of the tank, the liquid material flow line 5 needs not be inserted from the top of the tank but can be inserted from a side wall of the tank near the bottom of the tank. In embodiments, the tank may be nearly or substantially hexahedral or any other box-shaped. In an embodiment, the partition wall 25 can be disposed at an angle with respect to the bottom of the tank.

Figure 3:
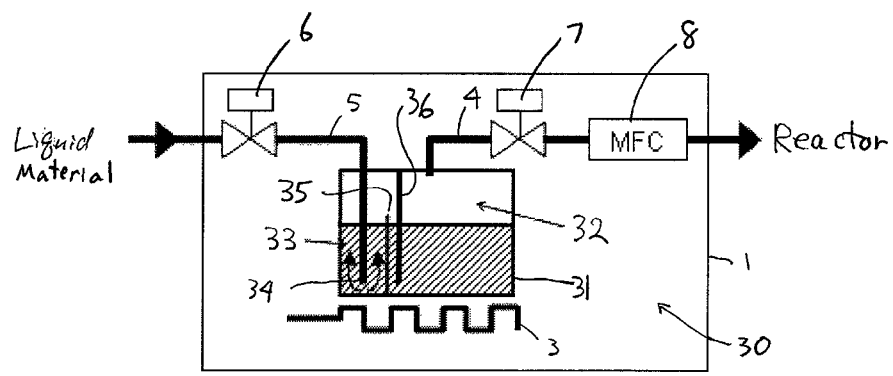

FIG. 3 is a schematic diagram of a liquid material vaporization apparatus according an embodiment of the present invention. In FIG. 3, a liquid material vaporization apparatus 30 further comprises another partition wall 36 which is disposed downstream of and in the vicinity of a partition wall 35 and which extends from a ceiling of a tank 31, wherein a lower end of the other partition wall 36 is disposed near the bottom of the tank 31 to flow the liquid material under the lower end to a vaporization compartment 32 after the liquid material overflows over the upper edge of the partition wall 35. In this embodiment, a charging compartment 33 is substantially the same as that in FIG. 2 or may be smaller than that in FIG. 2. The liquid material is charged into the charging compartment 33 via a liquid material inlet 34. A gas phase above the liquid material in the charging compartment 33 is isolated from the vaporization compartment 32, thereby improving thermal stability of the vaporized material. Further, the liquid material which has overflowed over the upper edge moves downward between the partition wall 35 and the other partition wall 36, and moves to the vaporization compartment 32 from a lower portion of the vaporization compartment, thereby improving thermal stability of the liquid material stored in the vaporization compartment. A gap between the partition wall 35 and the other partition wall 36 may be 5-10% of the length of the tank.

Figure 7:
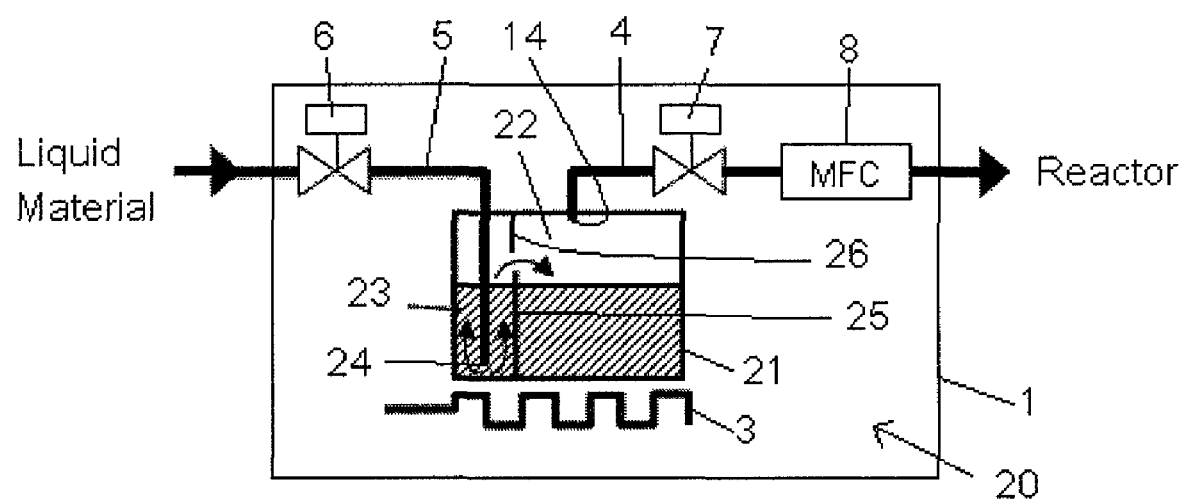

FIG. 7 is a schematic diagram of a liquid material vaporization apparatus according an embodiment of the present invention. The liquid material vaporization apparatus in FIG. 7 is the same as that indicated in FIG. 2 except that an upper partition wall 26 is additionally provided from the ceiling of the tank 21 so that a gas phase above the liquid material in the charging compartment 23 is isolated from the vaporization compartment 22, thereby improving thermal stability of the vaporized material. The upper partition wall 26 can be constructed in a manner similar to the partition wall 25. In embodiments, the upper partition wall 26 may be made of the same material such as stainless steel as the tank and may be welded to the tank to perform electro polishing together with the tank, whereas the partition wall 25 may be made of a material having high thermal conductivity so that the liquid material in the vaporization compartment does not receive significant influence of temperature changes which occur in the charging compartment 23 when the liquid material is charged into the charging compartment 23.

Figure 5:
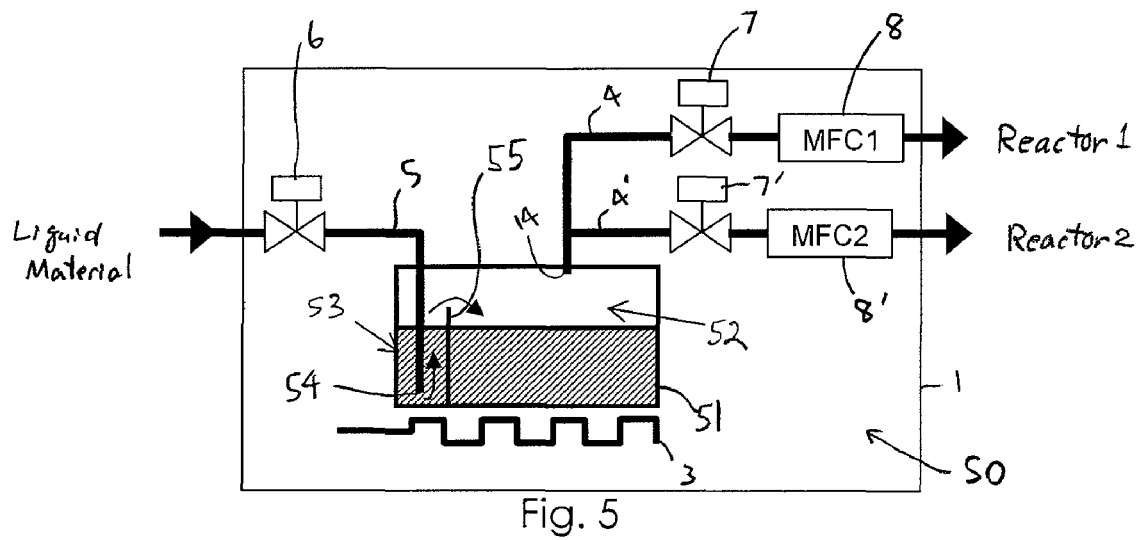

FIG. 5 is a schematic diagram of a liquid material vaporization apparatus according an embodiment of the present invention. In FIG. 5, a liquid material vaporization apparatus 50, a vaporized material outlet 14 is connected to branched flow lines 4, 4' for supplying the vaporized material to multiple reactors. The gas flow line 4' is also provided with a valve 7' and a mass flow controller 8'. A partition wall 55, a liquid material inlet 54, a charging compartment 53, and a tank 51 correspond to the partition wall 25, the liquid material inlet 24, the charging compartment 23, and the tank 21 in FIG. 2, respectively.

Figure 4:
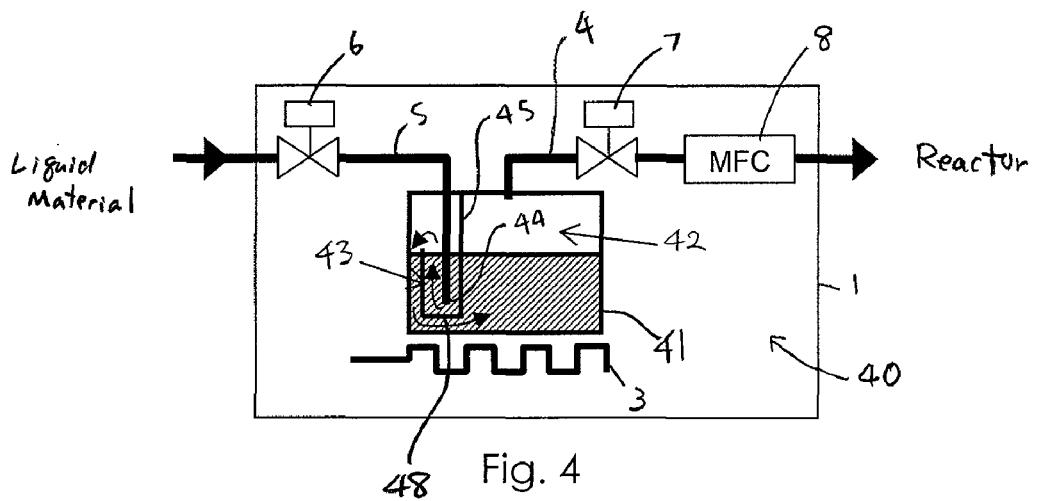

FIG. 4 is a schematic diagram of a liquid material vaporization apparatus according an embodiment of the present invention. In a liquid material vaporization apparatus 40, an inner partition wall 45 extends downwards from a ceiling and has a U-shaped cross sectional portion 48 having an upper edge, wherein a bottom of the U-shaped cross sectional portion 48 is disposed near a bottom of a tank 41. A charging compartment 43 is formed by the partition wall 45 with the U-shaped cross sectional portion 48. The liquid material is charged into the charging compartment 43 via a liquid material inlet 44 and overflows over the upper edge of the U-shaped cross sectional portion 48. The upper edge of the U-shaped cross sectional portion is disposed near a side wall of the tank 41 to flow the liquid material between the U-shaped cross sectional portion 48 and the side wall and under the bottom of the U-shaped cross sectional portion to the vaporization compartment 43 after the liquid material overflows over the upper edge of the U-shaped cross sectional portion 48. Similar to FIG. 3, thermal stability of the liquid material can be improved.

Figure 6:
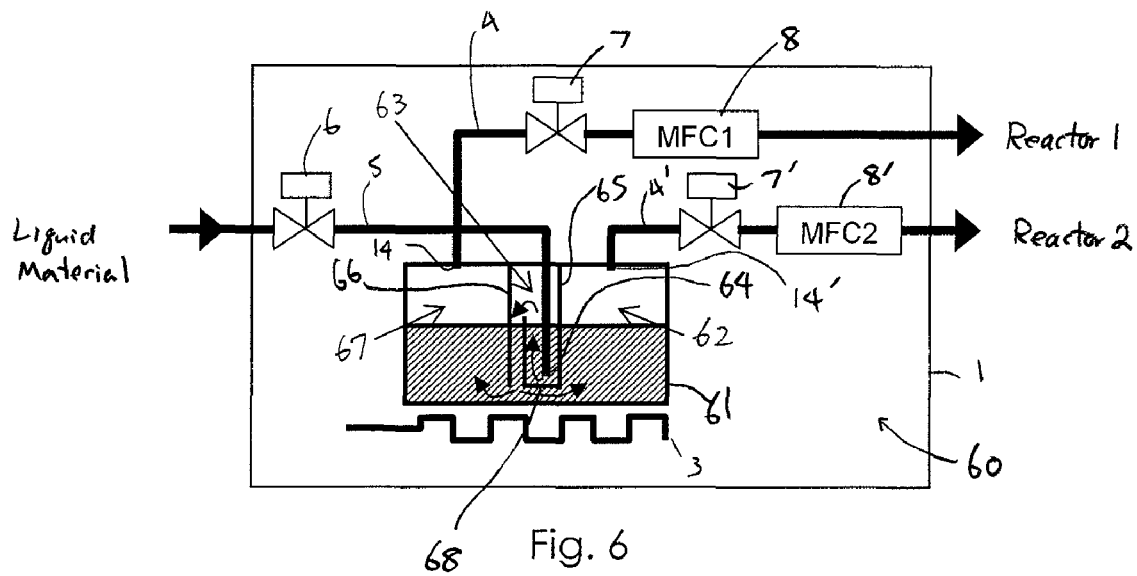

FIG. 6 is a schematic diagram of a liquid material vaporization apparatus according an embodiment of the present invention. In a liquid material vaporization apparatus 60, a partition wall 65 is disposed nearly in a middle of a tank 61 to divide a vaporization compartment into a first vaporization compartment 62 and a second vaporization compartment 67, and a vaporized material outlet comprises a first vaporized material outlet 14' and a second vaporized material outlet 14 provided in the first and second vaporization compartments 62, 67, respectively. The vaporization apparatus 60 further comprises another partition wall 66 which is disposed downstream of and in the vicinity of a U-shaped cross sectional portion 68 and which extends from a ceiling of the tank 61, wherein a lower end of the other partition wall 66 is disposed near the bottom of the tank 61 to flow the liquid material under the lower end to both the first and second vaporization compartments 62, 67 after the liquid material overflows over the upper edge of the U-shaped cross sectional portion 68. The liquid material is charged into the charging compartment 63 via a liquid material inlet 64 and overflows over the upper edge of the U-shaped cross sectional portion 68.

The embodiments described in connection to FIGS. 2-6 can be used in any combination with regard to elements indicated therein.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A liquid material vaporization apparatus for a semiconductor processing apparatus, comprising:
    a vaporization tank having an interior for containing both a liquid material and a vaporized material of the liquid material;
    an inner partition wall disposed in the tank and having an upper edge for dividing the interior of the tank into a charging compartment and a vaporization compartment which are liquid-communicatable with each other over the upper edge of the inner partition wall, wherein a liquid material charged in the charging compartment overflows over the upper edge of the inner partition wall toward the vaporization compartment to store and vaporize the liquid material in the vaporization compartment, wherein the inner partition wall extends downwards from a ceiling and has a U-shaped cross sectional portion having an end forming the upper edge, wherein a bottom of the U-shaped cross sectional portion is disposed near a bottom of the tank;
    a liquid material inlet disposed near the bottom of the U-shaped cross sectional portion and facing the inner partition wall extending downward from the ceiling in the charging compartment, for supplying the liquid material into the charging compartment of the tank, said liquid material inlet being connected to a liquid material source;
    a vaporized material outlet disposed in an upper portion of the vaporization compartment of the tank, for discharging a vaporized material of the liquid material from the vaporization compartment of the tank, wherein a passage from the liquid material inlet and the vaporized material outlet is formed to pass the same material through the liquid material inlet and the vaporized material outlet; and
    a heater disposed for heating the tank and thereby vaporizing the liquid material in the tank.

2. The liquid material vaporization apparatus according to claim 1, wherein the upper edge of the U-shaped cross sectional portion is disposed near a side wall of the tank to flow the liquid material between the U-shaped cross sectional portion and the side wall and under the bottom of the U-shaped cross sectional portion to the vaporization compartment after the liquid material overflows over the upper edge of the U-shaped cross sectional portion.

3. The liquid material vaporization apparatus according to claim 1, wherein the partition wall is disposed nearly in a middle of the tank to divide the vaporization compartment into first and second vaporization compartments, and the vaporized material outlet comprises first and second vaporized material outlets provided in the first and second vaporization compartments, respectively, said vaporization apparatus further comprising another partition wall which is disposed downstream of and in the vicinity of the U-shaped cross sectional portion and which extends from a ceiling of the tank, wherein a lower end of the other partition wall is disposed near the bottom of the tank to flow the liquid material under the lower end to both the first and second vaporization compartments after the liquid material overflows over the upper edge of the U-shaped cross sectional portion.

4. The liquid material vaporization apparatus according to claim 1, wherein the vaporized material outlet is connected to a flow line provided with a valve and a mass flow controller.

5. The liquid material vaporization apparatus according to claim 1, wherein the charging compartment has a volume which is 2% to 20% of the volume of the interior of the tank, said volume of the charging compartment being a volume of the liquid material which can be stored until the liquid material overflows over the upper edge.

6. The liquid material vaporization apparatus according to claim 1, wherein the volume of the interior of the tank is 1,000 to 2,000 cc.

7. The liquid material vaporization apparatus according to claim 1, wherein the charging compartment has a volume of 40 to 200 cc which is defined as a volume of the liquid material which can be stored until the liquid material overflows over the upper edge.

8. The liquid material vaporization apparatus according to claim 1, wherein the tank and the partition wall are made of stainless steel.

9. The liquid material vaporization apparatus according to claim 1, wherein the tank and the partition wall are welded together.

10. The liquid material vaporization apparatus according to claim 1, wherein the liquid material inlet is connected to a flow line provided with a valve which allows intermittent supply of the liquid material to the charging compartment.

11. A semiconductor processing apparatus comprising:
a reactor for processing a substrate by thermal chemical vapor deposition (thermal CVD), plasma enhanced chemical vapor deposition (PECVD), or atomic layer chemical vapor deposition (ALCVD); and
the liquid material vaporization apparatus of claim 1 coupled to the reactor for supplying a vaporized material to the reactor for the processing.

12. The apparatus according to claim 11, which is provided with no preheating device for heating the liquid material upstream of the liquid material vaporization apparatus.

13. A method of vaporizing a liquid material for a semiconductor processing apparatus, using the liquid material vaporization apparatus of claim 1, comprising:
intermittently supplying through the liquid material inlet a liquid material into Hall the charging compartment of the vaporization tank;
overflowing the liquid material charged in the charging compartment over the upper edge of the inner partition wall toward the vaporization compartment through the bottom of the U-shaped cross sectional portion of the inner partition wall, said overflowing liquid material having a higher temperature than the liquid material supplied at the liquid material inlet;
storing and vaporizing the liquid material in the vaporization compartment; and
discharging a vaporized material out of the vaporization compartment through a vaporized material outlet.

14. The method according to claim 13, wherein another partition wall is further disposed downstream of and in the vicinity of the partition wall and extends from a ceiling of the tank, and a lower end of the other partition wall is disposed near the bottom of the tank, wherein the liquid material flows under the lower end to the vaporization compartment after the liquid material overflows over the upper edge of the partition wall.

15. The method according to claim 13, wherein the vaporized material outlet is connected to branched flow lines, and the vaporized material is discharged to multiple reactors.

16. The method according to claim 13, wherein the partition wall is disposed nearly in a middle of the tank to divide the vaporization compartment into first and second vaporization compartments, and the vaporized material outlet comprises first and second vaporized material outlets provided in the first and second vaporization compartments, respectively, wherein another partition wall is further disposed downstream of and in the vicinity of the U-shaped cross sectional portion and extends from a ceiling of the tank, and a lower end of the other partition wall is disposed near the bottom of the tank, wherein the liquid material flows under the lower end to both the first and second vaporization compartments after the liquid material overflows over the upper edge of the U-shaped cross sectional portion.

17. The method according to claim 13, wherein the liquid material is charged in the charging compartment at a time in an amount which is less than 50% of a volume of the charging compartment being a volume of the liquid material which can be stored until the liquid material overflows over the upper edge.

18. The method according to claim 13, wherein the amount of the liquid material charged in the charging compartment at a time is 5-20 cc.

19. The method according to claim 13, wherein the liquid material supplied to the charging compartment of the tank is at room temperature.

* * * * *

UNITED STATES PATENT AND TRADEMARK OFFICE
CERTIFICATE OF CORRECTION

PATENT NO. : 7,833,353 B2  Page 1 of 1
APPLICATION NO. : 11/626777
DATED : November 16, 2010
INVENTOR(S) : Furukawahara et al.

It is certified that error appears in the above-identified patent and that said Letters Patent is hereby corrected as shown below:

In Claim 13, at column 10, line 5, after "into" and before "the" delete "Hall".

Signed and Sealed this
Twenty-fourth Day of April, 2012

David J. Kappos
*Director of the United States Patent and Trademark Office*